United States Patent
Chen et al.

(10) Patent No.: US 9,228,275 B2
(45) Date of Patent: Jan. 5, 2016

(54) APPARATUS WITH TWO-CHAMBER STRUCTURE FOR GROWING SILICON CARBIDE CRYSTALS

(75) Inventors: Zhizhan Chen, Shanghai (CN); Erwei Shi, Shanghai (CN); Chengfeng Yan, Shanghai (CN); Bing Xiao, Shanghai (CN)

(73) Assignees: RESEARCH AND DEVELOPMENT CENTER, SHANGHAI INSTITUTE OF CERAMICS, Shanghai (CN); SHANGHAI INSTITUTE OF CERAMICS, CHINESE ACADEMY OF SCIENCES, Shanghai (CN)

( * ) Notice: Subject to any disclaimer, the term of this patent is extended or adjusted under 35 U.S.C. 154(b) by 1041 days.

(21) Appl. No.: 13/379,608

(22) PCT Filed: Jun. 22, 2010

(86) PCT No.: PCT/CN2010/074204
§ 371 (c)(1), (2), (4) Date: Apr. 13, 2012

(87) PCT Pub. No.: WO2010/149017
PCT Pub. Date: Dec. 29, 2010

(65) Prior Publication Data
US 2012/0192790 A1    Aug. 2, 2012

(30) Foreign Application Priority Data
Jun. 22, 2009  (CN) .......................... 2009 1 0053568

(51) Int. Cl.
C30B 35/00  (2006.01)
C30B 29/36  (2006.01)
C30B 23/00  (2006.01)

(52) U.S. Cl.
CPC ................. *C30B 29/36* (2013.01); *C30B 23/00* (2013.01); *C30B 35/00* (2013.01)

(58) Field of Classification Search
CPC ...... Y10T 117/10; C30B 29/36; C30B 35/00; C30B 23/06
See application file for complete search history.

(56) References Cited

U.S. PATENT DOCUMENTS

| 5,441,011 A | 8/1995 | Takahaski et al. |
| 5,964,944 A | 10/1999 | Sugiyama et al. |
| 2007/0000444 A1* | 1/2007 | Shimizu ........................ 118/720 |

FOREIGN PATENT DOCUMENTS

| CN | 1327092 | 12/2001 |
| CN | 1327092 A | * 12/2001 |

(Continued)

OTHER PUBLICATIONS

Translation of CN 1544713 A.*
Translation of CN 1327092 A.*

*Primary Examiner* — Robert M Kunemund
(74) *Attorney, Agent, or Firm* — Bret E. Field; Bozicevic, Field & Francis LLP

(57) ABSTRACT

An apparatus with two-chamber structure for growing silicon carbide (SiC) crystals is disclosed. The apparatus comprises a sample feed chamber and a crystal growth chamber, both of which are separately connected with each other by a vacuum baffle valve and connected with a vacuum system. The crystal growth apparatus ensures that the insulation materials in the crystal growth chamber cannot contact with air, minimizes the adsorption of nitrogen and pollutants on the insulation materials and the growth chamber, improves purity of SiC crystals and achieves precise control of the impurities so that growth of high-quality SiC crystals such as conductive, doped semi-insulating or high-purity semi-insulating SiC crystals and the like is enabled.

8 Claims, 1 Drawing Sheet

(56) References Cited

FOREIGN PATENT DOCUMENTS

| CN | 1544713 | 11/2004 |
| CN | 1544713 A | * 11/2004 |
| CN | 101144179 | 3/2008 |
| CN | 201433250 | 3/2010 |

* cited by examiner

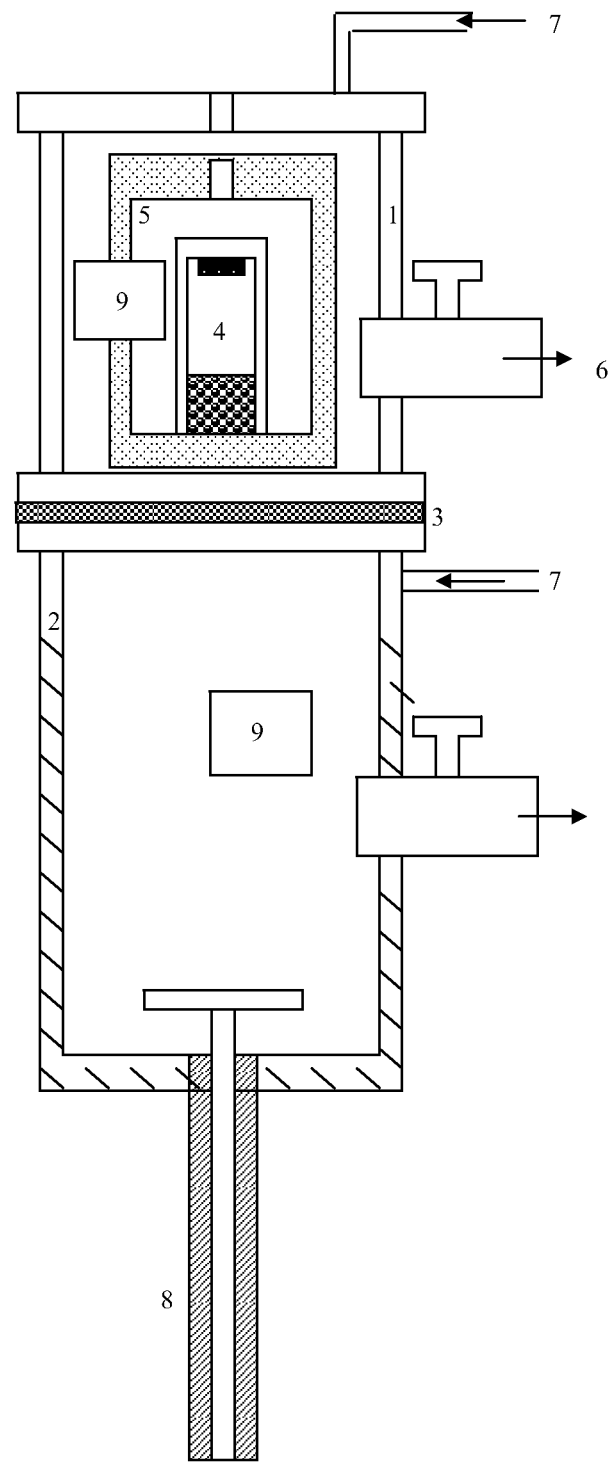

APPARATUS WITH TWO-CHAMBER STRUCTURE FOR GROWING SILICON CARBIDE CRYSTALS

TECHNICAL FIELD

The invention relates to the field of an apparatus for growing crystals, particularly to an apparatus with a two-chamber structure for growing silicon carbide crystals.

BACKGROUND ART

Silicon carbide is one of the core semiconductor materials of the third generation in our country. As compared with Si and GaAs, silicon carbide has a good number of advantages, such as wide band gap, high thermal conductivity, high electron saturation drift velocity, good chemical stability, etc., which make it very suitable for use in manufacturing electronic devices compatible with high temperature, high frequency, anti-radiation, large power and high density integration. Silicon carbide has gained high attention in various countries owing to its great importance.

Silicon carbide is mainly grown using seeded vapor transport technology (PVT), according to which highly pure (electronic grade) silicon carbide powder is exposed to temperatures of higher than 2000° C. with a temperature gradient along the seed crystals of silicon carbide, so that vapor transport of the Si and C components occurs from the powder to the seed crystals, and oriented growth of silicon carbide crystals on the seed crystals is thus effected. Despite all the advantages of silicon carbide, it has not been used widely for a long time due to its special preparation method in which growth of perfect crystals is difficult. The main challenges faced by the silicon carbide growth technology include enhancement of crystal purity and precise control of impurities, so as to lower the lattice defect density during crystal growth to a large extent. As the predominant component of air, nitrogen serves as a donor impurity for providing electrons to silicon carbide, and may have significant influence on the resistivity of the material even at a concentration of 1 ppm. Thus, it is yet quite difficult to make silicon carbide have an impurity concentration of $10^{13}$~$10^{14}$ cm$^{-3}$ as in the long base region of a high-voltage silicon thyristor. To date, it is hard to prepare an n-type 6H-silicon carbide crystal with an effective impurity concentration of lower than $10^{16}$ cm$^{-3}$ by sublimation method.

The apparatuses for growing silicon carbide crystals in the prior art generally use a single-chamber structure. For example, U.S. Pat. No. 6,200,917 discloses a vacuum growth chamber which is made from quartz glass and composed of sealing ring, bottom flange, quartz tube and top cap, wherein an induction coil is disposed outside of the quartz glass. For another example, in Chinese Patent Application CN200310113521.X, a metal cavity, in which an induction coil is placed, is used as a single vacuum growth chamber. Since the vacuum growth chamber has to be opened each time for charging the starting material before the crystal growth and removing the crystals after the crystal growth, the vacuum growth chamber contacts atmosphere and is thus extremely susceptible to atmospheric contamination and nitrogen adsorption. Therefore, it is very difficult to achieve crystal growth of highly pure semi-insulating silicon carbide and crystal growth of silicon carbide under precise impurity control.

In summary, the apparatuses used in the prior art for growing silicon carbide crystals can hardly achieve crystal growth of highly pure semi-insulating silicon carbide and crystal growth of silicon carbide under precise impurity control, and thus can not meet the demand of developing power devices on silicon carbide crystals.

SUMMARY OF THE INVENTION

The object of the invention is to overcome the drawbacks of the prior art and propose an apparatus with a two-chamber structure for growing silicon carbide crystals.

The key point of the invention is the consideration of the fact that high requirement is imposed on the nitrogen adsorption of the growth system during the growth of the silicon carbide crystals. If a crystal growth chamber and a sample feed chamber form a two-chamber structure, exposure of the silicon carbide crystal growth system to atmosphere during starting material charging and sample discharging will be avoided effectively, so that adsorption of nitrogen and other contaminants by the growth chamber will be minimized, and the concentration of the nitrogen donor impurity not doped intentionally in the growing crystals will be decreased effectively.

The invention comprises a crystal growth chamber (1), a sample feed chamber (2), a vacuum baffle valve (3), a growth crucible (4), thermal insulation material (5), a vacuum system (6), a gas intake system (7) and a delivery means (8);

wherein the crystal growth chamber (1) and the sample feed chamber (2) are disposed in an upper-and-lower arrangement or a side-by-side arrangement;

wherein the arrangement is preferably an upper-and-lower arrangement;

wherein the vacuum baffle valve (3) is disposed between and connects the crystal growth chamber (1) and the sample feed chamber (2), and may be opened or closed;

wherein the delivery means (8) is attached to the sample feed chamber; and the growth crucible (4) is delivered by the delivery means (8) from the sample feed chamber (2) to the crystal growth chamber (1) via the vacuum baffle valve (3);

wherein the crystal growth chamber (1) and the sample feed chamber (2) are connected with the vacuum system (6) and the gas intake system (7);

wherein the crystal growth chamber (1) comprises the thermal insulation material (5);

wherein the material for the crystal growth chamber (1) and the sample feed chamber (2) is preferably selected from sealed double-shell quartz glass tube or double-layer water-cooling stainless steel;

wherein the thermal insulation material (5) preferably encloses the growth crucible (4);

wherein the growth crucible (4) is preferably a graphite crucible;

wherein the gas intake system (7) is preferably a multi-path gas intake system;

wherein the delivery means (8) is preferably a rotary delivery means; and wherein the crystal growth chamber (1) and/or the sample delivery chamber (2) preferably comprise a door opener (9) or an observation window.

With the apparatus for growing silicon carbide crystals according to the invention, crystal growth of highly pure semi-insulating silicon carbide and crystal growth of silicon carbide under precise impurity control may be achieved, wherein conductive and doped semi-insulating silicon carbide crystals with controllable resistivity and dopant concentration, highly pure semi-insulating silicon carbide crystals with high quality, silicon carbide crystals in the forms of 4H, 6H, 15R, 3C and the like, and n-type and p-type doped silicon carbide crystals may be grown.

BRIEF DESCRIPTION OF THE DRAWINGS

FIG. 1 shows an apparatus with a two-chamber structure in an upper-and-lower arrangement for growing silicon carbide crystals according to the invention. In the figure, reference number (1) stands for the crystal growth chamber, (2) for the sample feed chamber, (3) for the baffle valve, (4) for the growth crucible, (5) for the thermal insulation material, (7) for the gas intake system, (6) for the vacuum system, (8) for the delivery means, and (9) for the door opener or the observation window.

DETAILED DESCRIPTION OF THE INVENTION

After extensive and intensive study, the inventors have proposed an apparatus for achieving crystal growth of highly pure semi-insulating silicon carbide and crystal growth of silicon carbide under precise impurity control. The apparatus may be used to grow conductive and doped semi-insulating silicon carbide crystals with controllable resistivity and dopant concentration, highly pure semi-insulating silicon carbide crystals with high quality, silicon carbide crystals in the forms of 4H, 6H, 15R, 3C and the like, and n-type and p-type doped silicon carbide crystals. The invention is completed on this foundation.

Various aspects of the invention will be further described in detail as follows.

The invention comprises a crystal growth chamber, a sample feed chamber, a vacuum baffle valve, a growth crucible, thermal insulation material, a vacuum system, a gas intake system and a delivery means.

Specifically, the sample feed chamber and the crystal growth chamber (two chambers) used in the invention are partitioned using the vacuum baffle valve therebetween.

Specifically, the two chambers (the sample feed chamber and the crystal growth chamber) are connected with the vacuum system to obtain high vacuum in the two chambers.

Specifically, the delivery of the growth crucible from the sample feed chamber to the crystal growth chamber is fulfilled by the delivery means.

Specifically, a door opener or an observation window may be disposed on each of the two chambers for observing the location of the crucible in the crystal growth system and the growth of the crystals.

Specifically, the sample feed chamber and the crystal growth chamber are connected with the gas intake system to effect Ar atmosphere protection and growth pressure control, or precise control over the intake flow of the dopant gas.

The thermal insulation material is not limited on condition that it does not restrict the object of the invention.

By way of combinations of the foregoing technical means, the apparatus of the invention realizes the following development: conductive and doped semi-insulating silicon carbide crystals with controllable resistivity and dopant concentration, highly pure semi-insulating silicon carbide crystals with high quality, silicon carbide crystals in the forms of 4H, 6H, 15R, 3C and the like, and n-type and p-type doped silicon carbide crystals may be grown.

The inventors believe that the main reason for the difficulty of the prior art in achieving crystal growth of highly pure semi-insulating silicon carbide and crystal growth of silicon carbide under precise impurity control is that nitrogen is susceptible to adsorption on the inner wall and in the starting material within the growth apparatus, and often exists as a doping element in the growth system. Therefore, the inventors believe that reduction of nitrogen content in the growth system and the starting material is vital to the growth of highly pure semi-insulating silicon carbide crystals. When a single-chamber apparatus is used to grow highly pure semi-insulating silicon carbide crystals, hydrogen is generally used as a protection atmosphere to purge the nitrogen adsorbed on the inner wall of the apparatus and in the starting material, so as to decrease the nitrogen content in the growth system and achieve final growth of highly pure semi-insulating silicon carbide crystal. This method entails the use of a large quantity of hydrogen which may form an explosive mixture with air and explode upon contact with heat or flame. Thus, the use of hydrogen has certain danger. The inventors have proposed a novel apparatus with a two-chamber structure for growing silicon carbide crystals, which avoids long time exposure of the growth chamber to air and thus adsorption of nitrogen molecules. Therefore, nitrogen content in the growth system is reduced significantly, and hydrogen is not needed to be used as a protection atmosphere to remove the adsorbed nitrogen in the growth system. While the underlying peril of using hydrogen is eliminated, highly pure semi-insulating silicon carbide crystals may be grown at the end as well.

To further demonstrate the structure and features of the invention, a two-chamber structure in an upper-and-lower arrangement (FIG. 1) will be taken as an example to further describe the invention which is not limited by the example.

A specific mode for carrying out the embodiment:

In the preparatory stage for crystal growth, the thermal insulation material (5) is disposed in the crystal growth chamber (1) constantly. High vacuum up to an order of magnitude of $10^{-4}$Pa is applied to the crystal growth chamber (1) and the sample feed chamber (2) using the vacuum system (6). The vacuum baffle valve (3) is closed to partition the crystal growth chamber (1) and the sample feed chamber (2), and the crystal growth chamber (1) is filled with highly pure Ar to one atmosphere through the gas intake system (7) for protection. The door opener (9) of the sample feed chamber is opened, and the graphite crucible (4) precharged with starting material and seed crystals is placed on the tray of the rotary delivery means (8). The door opener (9) of the sample feed chamber is closed. The sample feed chamber (2) is applied with high vacuum using the vacuum system (6), and then filled with highly pure Ar to one atmosphere through the gas intake system (7). The vacuum baffle valve (3) is opened, so that the two chambers communicate with each other. The rotary delivery means (8) is operated to send the graphite crucible (4) into the crystal growth chamber (1) and dispose it within the thermal insulation material (5).

A temperature control system begins heating to raise the temperature to above 2000° C. and then keeps the temperature constant. Meanwhile, the pressure is lowered to an appropriate level, and then a pressure control system is used to maintain a vacuum Silicon carbide crystals are allowed to grow until silicon carbide crystals of pre-determined size are obtained. After the crystal growth is completed, the apparatus is cooled to room temperature. The graphite crucible (4) is sent back to the sample feed chamber (2) using the rotary delivery means (8). The vacuum baffle valve (3) is closed, and then the door opener (9) of the sample feed chamber is opened to take out the silicon carbide crystals.

The whole scheme ensures no contact of the thermal insulation material in the crystal growth chamber (3) with air from the beginning to the end of the growth. In normal conditions, either high vacuum state is kept or highly pure Ar is filled for atmosphere protection. Thus, adsorption of nitrogen by the thermal insulation material and the growth chamber is minimized, so that the object of growing highly pure semi-insulating silicon carbide crystals and growing silicon carbide crystals under precise impurity control is realized.

EXAMPLE 1

Preparation of Highly Pure Semi-insulating Silicon Carbide Crystals

According to the above specific mode for carrying out the embodiment, the starting material charged in the graphite crucible (4) was highly pure silicon carbide powder, or highly pure Si powder and C powder. Only highly pure Ar gas was fed from the gas intake system (7) to provide atmosphere protection and pressure adjustment. The grown silicon carbide crystals were colorless or nearly colorless. The crystal size was not smaller than 2 inches, and the resistivity was greater than $10^5$ Ω·cm.

EXAMPLE 2

Preparation of Semi-insulating Silicon Carbide Crystals Doped with Vanadium According to the above specific mode for carrying out the embodiment, the starting material charged in the graphite crucible (4) was highly pure silicon carbide powder, or highly pure Si powder and C powder, along with 0.3% vanadium carbide for doping. Only highly pure Ar gas was fed from the gas intake system (7) to provide atmosphere protection and pressure adjustment. The grown silicon carbide crystals varied from pale yellow to brown with increasing doping concentration of vanadium. The crystal size was not smaller than 2 inches, and the resistivity was controllable and greater than $10^5$ Ω·cm.

EXAMPLE 3

Preparation of Conductive Silicon Carbide Crystals Doped with Nitrogen

According to the above specific mode for carrying out the embodiment, the starting material charged in the graphite crucible (4) was highly pure silicon carbide powder, or highly pure Si powder and C powder. Highly pure Ar gas was fed from the multi-path gas intake pipe (7) to provide atmosphere protection and pressure adjustment, and highly pure nitrogen was fed at controlled flow concurrently. Conductive silicon carbide crystals with controllable doping concentration were grown. The crystals varied from light green to dark green with increasing doping concentration of nitrogen. The crystal size was not smaller than 2 inches, and the resistivity was controllable.

The invention claimed is:

1. An apparatus with a two-chamber structure for growing silicon carbide crystals, the apparatus comprising:
    a crystal growth chamber, a sample feed chamber, a vacuum baffle valve, a growth crucible, thermal insulation material, a vacuum system, a gas intake system and a delivery means, wherein:
    the crystal growth chamber and the sample feed chamber are disposed in an upper-and-lower arrangement or a side-by-side arrangement;
    the vacuum baffle valve is disposed between and connects the crystal growth chamber and the sample feed chamber;
    the growth crucible present in the sample feed chamber and configured to be delivered by the delivery means from the sample feed chamber to the crystal growth chamber and dispose it within the thermal insulation material present in the crystal growth chamber;
    the crystal growth chamber and the sample feed chamber are connected with the vacuum system and the gas intake system respectively;
    the crystal growth chamber comprises the thermal insulation material.

2. The apparatus with a two-chamber structure for growing silicon carbide crystals according to claim 1, wherein the arrangement is an upper-and-lower arrangement.

3. The apparatus with a two-chamber structure for growing silicon carbide crystals according to claims 1 or 2, wherein the material for the crystal growth chamber and the sample feed chamber is selected from sealed double-shell quartz glass tube or double-layer water-cooling stainless steel.

4. The apparatus with a two-chamber structure for growing silicon carbide crystals according to claims 1 or 2, wherein the thermal insulation material encloses the growth crucible.

5. The apparatus with a two-chamber structure for growing silicon carbide crystals according to claims 1 or 2, wherein the growth crucible is a graphite crucible.

6. The apparatus with a two-chamber structure for growing silicon carbide crystals according to claims 1 or 2, wherein the gas intake system is a multi-path gas intake system.

7. The apparatus with a two-chamber structure for growing silicon carbide crystals according to claims 1 or 2, wherein the delivery means is a rotary delivery means.

8. The apparatus with a two-chamber structure for growing silicon carbide crystals according to claims 1 or 2, wherein the crystal growth chamber and/or the sample delivery chamber comprise a door opener or an observation window.

* * * * *